US008831067B2

(12) United States Patent
Chen et al.

(10) Patent No.: US 8,831,067 B2
(45) Date of Patent: Sep. 9, 2014

(54) METHOD AND SYSTEM FOR CHANNEL STATE INFORMATION FEEDBACK

(75) Inventors: Yijian Chen, Shenzhen (CN); Guanghui Yu, Shenzhen (CN); Junfeng Zhang, Shenzhen (CN); Shupeng Li, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 117 days.

(21) Appl. No.: 13/634,578

(22) PCT Filed: Nov. 5, 2010

(86) PCT No.: PCT/CN2010/078469
§ 371 (c)(1),
(2), (4) Date: Sep. 13, 2012

(87) PCT Pub. No.: WO2011/124065
PCT Pub. Date: Oct. 13, 2011

(65) Prior Publication Data
US 2013/0208819 A1 Aug. 15, 2013

(30) Foreign Application Priority Data
Apr. 5, 2010 (CN) .......................... 2010 1 0162569

(51) Int. Cl.
*H04B 1/00* (2006.01)
*H04B 7/04* (2006.01)
*H04L 1/00* (2006.01)

(52) U.S. Cl.
CPC ............ *H04B 7/0417* (2013.01); *H04L 1/0026* (2013.01); *H04B 7/0478* (2013.01); *H04L 1/0028* (2013.01); *H04B 7/0469* (2013.01)
USPC ............ 375/141; 375/267; 375/299; 375/347

(58) Field of Classification Search
CPC .. H04B 7/0639; H04B 7/0634; H04B 7/0626; H04B 7/0632; H04B 7/0452; H04B 7/0691; H04B 7/0456; H04B 7/0619; H04B 7/0478; H04B 7/061; H04B 7/0663

USPC ......... 375/141, 144, 146–148, 220, 221, 267, 375/285, 295, 299, 340, 347, 349
See application file for complete search history.

(56) References Cited

U.S. PATENT DOCUMENTS 7,672,837 B2    3/2010  Bessette
8,488,725 B2 *  7/2013  Yuan et al. .................... 375/346
(Continued)

FOREIGN PATENT DOCUMENTS

CN   101330479 A   12/2008
CN   101631004 A    1/2010
(Continued)

OTHER PUBLICATIONS

International Search Report for PCT/CN2010/078469 dated Jan. 24, 2011.
(Continued)

*Primary Examiner* — Dac Ha
(74) *Attorney, Agent, or Firm* — Stephen Yang; Ling Wu; Ling and Yang Intellectual Property

(57) ABSTRACT

The present invention discloses a method for feeding back channel information, which includes: configuring a same codebook space at a data transmitting end and a data receiving end (101); the data receiving end selecting, from the codebook space, a codeword matched with a channel, and transmitting a sequence number corresponding to the codeword to the data transmitting end (102); and the data transmitting end extracting, according to the sequence number, a corresponding codeword from a locally-configured codebook space to obtain channel state information (103). The present invention also discloses a system for feeding back channel information, which includes a data transmitting end and a data receiving end. The method and system for feeding back channel information solve the problem that there is no channel information feedback method for dual-polarized channels.

13 Claims, 2 Drawing Sheets

(56) References Cited

U.S. PATENT DOCUMENTS

| | | | |
|---|---|---|---|
| 2008/0013644 A1 | 1/2008 | Hugl et al. | |
| 2008/0186212 A1 | 8/2008 | Clerckx | |
| 2008/0268785 A1* | 10/2008 | McCoy et al. | 455/67.11 |
| 2009/0252240 A1* | 10/2009 | Kwon et al. | 375/260 |
| 2010/0142599 A1* | 6/2010 | Tang et al. | 375/219 |

FOREIGN PATENT DOCUMENTS

| | | |
|---|---|---|
| CN | 101635612 A | 1/2010 |
| CN | 101667895 A | 3/2010 |
| CN | 101854236 A | 10/2010 |

OTHER PUBLICATIONS

"Investigation on dual polarization channel and codebook"; ZTE, 7.5, Discussion and Decision; 3GPP TSG RAN WG1 Meeting #59; Jeju, Korea, Nov. 9-13, 2009; R1-094753, See pp. 2-6/E.

"DL Codebook design for 8Tx precoding"; LG Electronics, 7.2.4.4, Discussion; 3GPP TSG RAN WG1 Meeting #59bis; Valencia, Spain, Jan. 18-22, 2010; R1-100651, See pp. 2-7/E.

"Further Investigation on dual polarization uncorrelation channel and codebook"; ZTE, 7.5, Discussion and Decision; 3GPP TSG RAN WG1 Meeting #59; Jeju, Korea, Nov. 9-13, 2009; R1-094754, See pp. 2-5/E.

"Feedback bit-width requirement for 8 tx codebook"; Alcatel-Lucent Shanghai Bell, Alcatel-Lucent, 7.2.4.4, Discussion/ Decision; 3GPP TSG RAN WG1 Meeting #59bis; Valencia, Spain, Jan. 18-22, 2010; R1-100721(R1-100430), See pp. 2-9/E.

"Clarification on explicit feedback vs. implicit feedback"; 7.2.4.1, Alcatel-Lucent Shanghai Bell, Alcatel-Lucent, Discussion / Decision; 3GPP TSG RAN WG1 Meeting #60; San Francisco, USA, Feb. 22-26, 2010; R1-100926, See pages 1-2.

"Views on CSI Feedback Scheme for MU-MIMO in LTE-Advanced"; NTT DOCOMO, 7.2.4.1, Discussion; 3GPP TSG RAN WG1 Meeting #60; San Francisco, USA, Feb. 22-26, 2010; R1-101217, See pages 1-5.

* cited by examiner

METHOD AND SYSTEM FOR CHANNEL STATE INFORMATION FEEDBACK

TECHNICAL FIELD

The present invention relates to a Multi-Input Multi-Output (MIMO) system in the communication field, and in particular, to a method and system for feeding back Channel State Information (CSI) when the channel matrix is low rank.

BACKGROUND ART

In wireless communication, if both the transmitting end and the receiving end use a plurality of antennas, a higher rate can be obtained by means of space multiplexing. With respect to the general space multiplexing method, an enhanced technology is that the receiving end feeds back the channel state information to the transmitting end, and the transmitting end uses some transmission pre-coding techniques according to the obtained channel state information, thereby greatly improving the transmission performance. A simple utilization method is to perform pre-coding directly using the channel feature vector information, which is mainly used in single-user MIMO. There are also some other methods that are more preferable but more complicated, which are mainly used in multi-user MIMO.

The concept of layer is defined at the transmitting end, each layer can transmit different data symbols on the same time frequency resource, and the number of layers is equal to the Rank of channel matrix. If the complete channel state information can be known accurately at the transmitting end, linear or non-linear pre-coding can be performed on the data on the layer using the obtained CSI, so that the Signal-to-Noise ratio of the data received by the user when reaching the receiving end is the maximum, and the inter-layer interference and inter-user interference are the minimum.

If the channel state information can be accurately obtained, the optimal pre-coding can be achieved. However, channel state information (CSI) generally can only be obtained directly and accurately at the receiving end, and generally the CSI can only be obtained by the transmitting end through the receiving end, which feeds back the CSI to the transmitting end. An important issue problem is how to efficiently quantify the fed back CSI information. In the current mainstream standards, the feedback capacity provided for the CSI by the system is relatively limited, and since the feedback quantity of feeding back the whole channel state information is very large, the mainstream feedback methods are all based on the quantization modes of the codebook.

The basic principle of channel state information quantization feedback based on the codebook is as follows: if it is assumed that the limited feedback channel capacity is B bps/Hz, the number of available codewords is $N=2^B$. The feature vector space of the channel matrix constitutes, after being quantified, the codebook space $\Re = \{F_1, F_2 L\ F_N\}$. The transmitting end and the receiving end jointly store or generate in real time the codebook space (the same at the transmitting and receiving ends). For each time of channel implementation H, the receiving end selects from $\Re$, according to a certain rule, a codeword F mostly matched with the channel, and feeds the sequence number i of the codeword back to the transmitting end. The transmitting end finds out the pre-coded codeword F according to the sequence number and obtains the channel state information, which is mainly the feature vector information of the channel.

Generally, $\Re$ may be further divided into codebooks corresponding to a plurality of Ranks, each Rank corresponds to a plurality of codewords for quantifying a pre-coded matrix constituted by feature vectors of the channel matrix under the Rank. Since the number of Ranks of the channel and the number of non-zero feature vectors are the same, there are generally N columns of codewords when the number of Ranks is N. Therefore, the codebook $\Re$ can be divided into a plurality of sub-codebooks according to the Rank, as shown in Table 1.

In a case where the CSI can be obtained completely and accurately, the performance of pre-coding according to the CSI is the best, and due to the limit of feedback overhead, codebook-based channel state information quantization feedback is usually adopted.

TABLE 1

| $\Re$ | | | |
|---|---|---|---|
| Number of layers υ (Rank) | | | |
| 1 | 2 | ... | N |
| $\Re_1$ Set of codeword vectors of column 1 | $\Re_2$ Set of codeword matrices of column 2 | ... | $\Re_N$ Set of codeword matrices of column N |

Wherein, when Rank>1, the codewords that need to be stored are all in a form of matrix, for example the codebook in the Long Term Evolution (LTE) protocol precisely adopts this codebook quantization feedback method, as shown in Table 2. Hereinafter, the vector can also be regarded as a matrix with one of the dimensions being 1 for the purpose of consistence.

The LTE downlink 4Tx codebook is as shown in Table 2, and the meaning of pre-coded codebook in LTE is actually the same with that of the channel state information quantization codebook.

TABLE 2

| Codebook Index | $u_n$ | Total number of layers υ | | | |
|---|---|---|---|---|---|
| | | 1 | 2 | 3 | 4 |
| 0 | $u_0 = [1\ -1\ -1\ -1]^T$ | $W_0^{\{1\}}$ | $W_0^{\{14\}}/\sqrt{2}$ | $W_0^{\{124\}}/\sqrt{3}$ | $W_0^{\{1234\}}/2$ |
| 1 | $u_1 = [1\ -j\ 1\ j]^T$ | $W_1^{\{1\}}$ | $W_1^{\{12\}}/\sqrt{2}$ | $W_1^{\{123\}}/\sqrt{3}$ | $W_1^{\{1234\}}/2$ |
| 2 | $u_2 = [1\ 1\ -1\ 1]^T$ | $W_2^{\{1\}}$ | $W_2^{\{12\}}/\sqrt{2}$ | $W_2^{\{123\}}/\sqrt{3}$ | $W_2^{\{3214\}}/2$ |
| 3 | $u_3 = [1\ j\ 1\ -j]^T$ | $W_3^{\{1\}}$ | $W_3^{\{12\}}/\sqrt{2}$ | $W_3^{\{123\}}/\sqrt{3}$ | $W_3^{\{3214\}}/2$ |
| 4 | $u_4 = [1\ (-1-j)/\sqrt{2}\ -j\ (1-j)/\sqrt{2}]^T$ | $W_4^{\{1\}}$ | $W_4^{\{14\}}/\sqrt{2}$ | $W_4^{\{124\}}/\sqrt{3}$ | $W_4^{\{1234\}}/2$ |
| 5 | $u_5 = [1\ (1-j)/\sqrt{2}\ j\ (-1-j)/\sqrt{2}]^T$ | $W_5^{\{1\}}$ | $W_5^{\{14\}}/\sqrt{2}$ | $W_5^{\{124\}}/\sqrt{3}$ | $W_5^{\{1234\}}/2$ |
| 6 | $u_6 = [1\ (1+j)/\sqrt{2}\ -j\ (-1+j)/\sqrt{2}]^T$ | $W_6^{\{1\}}$ | $W_6^{\{13\}}/\sqrt{2}$ | $W_6^{\{134\}}/\sqrt{3}$ | $W_6^{\{1324\}}/2$ |
| 7 | $u_7 = [1\ (-1+j)/\sqrt{2}\ j\ (1+j)/\sqrt{2}]^T$ | $W_7^{\{1\}}$ | $W_7^{\{13\}}/\sqrt{2}$ | $W_7^{\{134\}}/\sqrt{3}$ | $W_7^{\{1324\}}/2$ |
| 8 | $u_8 = [1\ -1\ 1\ 1]^T$ | $W_8^{\{1\}}$ | $W_8^{\{12\}}/\sqrt{2}$ | $W_8^{\{124\}}/\sqrt{3}$ | $W_8^{\{1234\}}/2$ |
| 9 | $u_9 = [1\ -j\ -1\ -j]^T$ | $W_9^{\{1\}}$ | $W_9^{\{14\}}/\sqrt{2}$ | $W_9^{\{134\}}/\sqrt{3}$ | $W_9^{\{1234\}}/2$ |
| 10 | $u_{10} = [1\ 1\ 1\ -1]^T$ | $W_{10}^{\{1\}}$ | $W_{10}^{\{13\}}/\sqrt{2}$ | $W_{10}^{\{123\}}/\sqrt{3}$ | $W_{10}^{\{1324\}}/2$ |

TABLE 2-continued

| Codebook Index | $u_n$ | Total number of layers $\upsilon$ | | | |
|---|---|---|---|---|---|
| | | 1 | 2 | 3 | 4 |
| 11 | $u_{11} = [1\ j\ -1\ j]^T$ | $W_{11}^{\{1\}}$ | $W_{11}^{\{13\}}/\sqrt{2}$ | $W_{11}^{\{134\}}/\sqrt{3}$ | $W_{11}^{\{1324\}}/2$ |
| 12 | $u_{12} = [1\ -1\ -1\ 1]^T$ | $W_{12}^{\{1\}}$ | $W_{12}^{\{12\}}/\sqrt{2}$ | $W_{12}^{\{123\}}/\sqrt{3}$ | $W_{12}^{\{1234\}}/2$ |
| 13 | $u_{13} = [1\ -1\ 1\ -1]^T$ | $W_{13}^{\{1\}}$ | $W_{13}^{\{13\}}/\sqrt{2}$ | $W_{13}^{\{123\}}/\sqrt{3}$ | $W_{13}^{\{1324\}}/2$ |
| 14 | $u_{14} = [1\ 1\ -1\ -1]^T$ | $W_{14}^{\{1\}}$ | $W_{14}^{\{13\}}/\sqrt{2}$ | $W_{14}^{\{123\}}/\sqrt{3}$ | $W_{14}^{\{3214\}}/2$ |
| 15 | $u_{15} = [1\ 1\ 1\ 1]^T$ | $W_{15}^{\{1\}}$ | $W_{15}^{\{12\}}/\sqrt{2}$ | $W_{15}^{\{123\}}/\sqrt{3}$ | $W_{15}^{\{1234\}}/2$ |

Wherein, $W_n = I - 2u_n u_n^H / u_n^H u_n$, I is a unit matrix, $W_k^{(j)}$ represents the $j^{th}$ column of vectors of the matrix $W_k$. $W_k^{(j_1, j_2, \cdots, j_n)}$ represents a matrix constituted by the $j_1^{th}$, $j_2^{th}$, ..., $j_n^{th}$ columns of the matrix $W_k$.

With the development of communication technology, the advanced Long Term Evolution (LTE-Advance) has higher requirements on the spectrum efficiency, so the number of antennae also increases to 8. For this, it needs to design a 8Tx codebook to perform quantization feedback of channel state information. The main application form of the 8 antennae is dual-polarized antennae, so it needs to design a codebook suitable for dual-polarized channels, and quantization feedback of channel state information is performed using this codebook.

When the CSI can be obtained completely and accurately, the performance of pre-coding is the best. Due to the limit of feedback overhead (the channel capacity used for feedback), it can only use the codebook based CSI feedback and pre-coding of the transmitted data symbols. In the practical MIMO system, the design of the codebook is very important, and one of the important objects of codebook design is to ensure that the quantization error is the minimum, and the codebook is simple to implement, the overhead is reasonable, and the storage amount is small.

Besides, in consideration of some specific applications, the codebook design should also have the following features.

1. Constant model feature: it is considered during the codebook design that the row vector of each pre-coded codeword in the codebook has the constant model feature so that the power distributed to each antenna after pre-coding is equal, thereby avoiding increase of the index of Peak to Average Power Ratio (PAPR), and the power amplification between various Power Amplifiers (PA) is balanced. Therefore, the basic requirement for constant model feature is that each row of the pre-coded matrix has the same model value, and when Rank=1, the constant model feature requires that the model values of various elements are equal.

2. Orthogonal feature: after Singular Value Decomposition (SVD) is performed on the channel matrix, each obtained right feature vector is bound to be orthogonal. The codebook is designed to be matched with the right feature vector direction of the channel matrix, so the designed codeword should also conform to this feature. In a pre-coded codeword where Rank>1, each column of vectors should be orthogonal. The orthogonal feature is an important principle, and no matter how the codebook is designed, the feature must be met so as to ensure the quantization accuracy of the codebook.

3. 8PSK feature: in consideration of the complexity of achieving pre-coding processing at the transmitting and receiving ends, it needs to define that the value of each element has to be selected from the points corresponding to 8 Phase Shift Keying (PSK), which is called as 8PSK feature. The codebook is defined to have the 8PSK feature, i.e., before normalization processing is performed on the codebook, the value of each element has to be selected from a letter set $$\left\{1, -1, j, -j, \frac{1+j}{\sqrt{2}}, \frac{-1+j}{\sqrt{2}}, \frac{1-j}{\sqrt{2}}, \frac{-1-j}{\sqrt{2}}\right\}$$

of 8PSK.

The LTE 4Tx codebook can better meet these rules.

The existing codebook used for channel state information quantization feedback mainly considers the channel applied by single-polarized antenna of the transmitting end, and the channels are distinguished in relevance in this antenna configuration, and the codewords that are suitable for high-relevant channel and independent channel features are used.

One of the directions of the current codebook design is that the completely independently irrelevant channel is considered for some codewords, i.e., each element in the channel (the channel between each pair of transmitting and receiving antennae is represented as a channel element in the channel matrix) is independently irrelevant (i.i,d), in which case the method for designing irrelevant channel codeword in the codebook where Rank is $\upsilon$ is as follows:

finding a plurality of matrices of $\upsilon$ columns (degrading to a vector when $\upsilon$ is 1) such that these multiple matrices (i.e., sub-spaces) are evenly distributed in the total space, where the main means is to use the method of Grassmannian line compression or sub-space compression to find the multiple codeword matrices evenly distributed in the total space.

The other direction is to consider the single-polarized array antenna scene with smaller antenna space. The channels are highly relevant, and at this moment the channels are not independently irrelevant, the feature vector represents a fixed model, for example when there are 8 antennae, the feature vector of the single-polarized antenna strongly-relevant channel is $[1\ e^{j\theta}\ e^{j2\theta}\ e^{j3\theta}\ \ldots\ e^{j7\theta}]$, wherein $\theta$ indicates different phase values. Such a model has the same model with the column vector of the Discrete Fourier Transform (DFT) matrix, therefore, the columns of the DFT matrix are selected as the codewords of the relevant channel.

The existing feedback apparatus and codebook designing idea are applied to various mainstream standards, for example, 3GPP and LTE adopt such apparatus and method.

However, the existing codebook design for channel state information quantification feedback mainly concerns the relevant and irrelevant statuses of single-polarized antenna channel. When there are 8 antennae, dual-polarized antennae have much wider application prospect in the practical application due to the antenna space, especially when the number of antennae is greater than or equal to 4, so dual-polarized antennae have become the mainstream application gradually. Nevertheless, some features represented by the dual-polarized antennae are usually very complicated, for example a dual-polarized relevant channel only shows high relevance in the same polarization direction, but does not have high relevance between polarized directions, while a dual-polarized irrelevant channel shows independent nature in the same polarization direction but the relationship shown between polarized directions is not independent. Therefore, in the prior art, the codebook design method of relevant channels and irrelevant channels in the case of single-polarized antenna cannot match the channel features well in a channel of dual-polarized antennae, and its performance in the dual-polarized channel is very bad.

Currently, the existing codebook design technologies all consider single-polarized antennae, and there is no good method for feeding back channel state information of dual-polarized channels.

SUMMARY OF THE INVENTION

The present invention provides a method and system for feeding back channel state information to solve the problem that there is no method for feeding back channel state information of dual-polarized channels.

In order to solve the above technical problem, the present invention provides a method for feeding back channel state information, comprising the following steps of:

configuring a same codebook space at a data transmitting end and a data receiving end;

the data receiving end selecting, from the codebook space, a codeword matched with a channel, and transmitting a sequence number corresponding to the codeword to the data transmitting end; and the data transmitting end extracting, according to the sequence number, a corresponding codeword from a locally-configured codebook space to obtain channel state information.

The step of configuring a same codebook space at a data transmitting end and a data receiving end comprises:

selecting $\kappa$ matrices $M_1 \ldots M_\kappa$ and $\kappa$ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a Rank of the channel, I and J are non-zero integers, I=J when r is an even number and I=J+1 or I=J−1 when r is an odd number;

constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix}.$$

O indicates an all-zero matrix.

The matrices $M_1 \ldots M_\kappa$ and the matrices $V_1 \ldots V_\kappa$ are both orthogonal matrices.

The matrices $M_1 \ldots M_\kappa$ and the matrices $V_1 \ldots V_\kappa$ meet a 8PSK feature, i.e., all elements in the above matrices are elements in a 8PSK letter set;

any column in any matrix in the matrices $M_1 \ldots M_\kappa$ is extracted from a same codeword or different codewords in a LTE Rank4 pre-coded codebook;

any column in any matrix in the matrices $V_1 \ldots V_\kappa$ is extracted from a same codeword or different codewords in a LTE Rank4 pre-coded codebook.

Since the LTE Rank4 pre-coded codebook has four rows, $M_1 \ldots M_\kappa$ and $V_1 \ldots V_\kappa$ are all matrices of four rows.

$M_n$ has a nesting relationship with $V_n$, i.e., part of columns in $M_n$ constitute $V_n$ or part of columns in $V_n$ constitute $M_n$, wherein $M_n$ is any matrix among matrices $M_1 \ldots M_\kappa$, and $V_n$ is any matrix among matrices $V_1 \ldots V_\kappa$.

$M_n$ is nested in a codeword in the LTE Rank4 pre-coded codebook, and $V_n$ is nested in another same or different codeword in the LTE Rank4 pre-coded codebook, wherein, $M_n$ is any matrix among matrices $M_1 \ldots M_\kappa$, and $V_n$ is any matrix among matrices $V_1 \ldots V_\kappa$.

The step of constructing the codeword in the codebook space comprises:

performing one or more of transforms among column exchange, row exchange and multiplication by a constant coefficient on the models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix},$$

to obtain transformed models of the models of $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix},$$

and constructing the codeword using the transformed models of the models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix}.$$

When the Rank of the channel is 1, the step of configuring a same codebook space at a data transmitting end and a data receiving end comprises:

selecting $\kappa$M-dimensional vectors $w_{\cdot 1} \ldots w_{\cdot \kappa}$, wherein $\kappa$ is a number of part or all of codewords that need to be generated in the codebook, and M is one half of a number of transmitting antennae; and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 ... $\kappa$.

The M-dimensional vectors $w_{\cdot 1} \ldots w_{\cdot \kappa}$ are any vectors extracted from a LTE Rank4 pre-coded codebook.

The M-dimensional vectors $w_{\cdot 1} \ldots w_{\cdot \kappa}$ are any vectors extracted from a LTE Rank1 pre-coded codebook.

In order to solve the above technical problem, the present invention further provides a system for feeding back channel state information, comprising a data transmitting end and a data receiving end;

the data transmitting end is configured to configure a same codebook space as the data receiving end, receive a sequence number of a codeword transmitted by the data receiving end, and extract, according to the sequence number, a corresponding codeword from a locally-configured codebook space to obtain channel state information;

the data receiving end is configured to configure a same codebook space as the data transmitting end, select, from the codebook space, the codeword matched with a channel, and transmit the sequence number corresponding to the codeword to the data transmitting end.

The data transmitting end is configured to configure a same codebook space as the data receiving end in the following way:

selecting $\kappa$ matrices $M_1 \ldots M_\kappa$ and $\kappa$ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a Rank of the channel, I=J when r is an even number, and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix};$$

or when the Rank of the channel is 1, selecting $\kappa$ M-dimensional vectors $w_{\cdot 1} \ldots w_{\cdot\kappa}$, wherein $\kappa$ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 . . . $\kappa$.

The data receiving end is configured to configure a same codebook space as the data transmitting end in the following way:

selecting $\kappa$ matrices $M_1 \ldots M_\kappa$ and $\kappa$ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a Rank of the channel, I=J when r is an even number, and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix};$$

or when the Rank of the channel is 1, selecting $\kappa$ M-dimensional vectors $w_{\cdot 1} \ldots w_{\cdot\kappa}$, wherein $\kappa$ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 . . . $\kappa$.

In the method and system for feeding back channel state information provided by the present invention, the same codebook space is configured at a data transmitting end and a data receiving end, the data receiving end selects, from the codebook space, a codeword matched with a channel, and transmits a sequence number corresponding to the codeword to the data transmitting end, and the data transmitting end extracts, according to the sequence number, a corresponding codeword from a locally-configured codebook space to obtain channel information, and during configuration of the codebook space, $\kappa$ matrices $M_1 \ldots M_\kappa$ and $\kappa$ matrices $V_1 \ldots V_\kappa$ are selected, wherein a dimensionality of $M_1 \ldots M_\kappa$ is 4×I, a dimensionality of $V_1 \ldots V_\kappa$ is 4×J, I+J=r, r is a Rank of the channel, I and J are non-zero integers, I=J when r is an even number while I=J+1 or I=J−1 when r is an odd number, and the codeword in the codebook space is constructed using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix},$$

thereby constructing a codebook space universal for multiple Ranks, which solves the problem that there is no method for feeding back channel state information of dual-polarized channels. Furthermore, for a channel with a Rank of 1, $\kappa$ M-dimensional vectors $w_{\cdot 1} \ldots w_{\cdot\kappa}$ are selected, wherein $\kappa$ is a number of part or all of codewords that need to be generated in the codebook, and M is one half of a number of transmitting antennae, and the codeword in the codebook space is constructed using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 . . . $\kappa$, which makes the construction and generation of the codebook space more flexible.

PREFERRED EMBODIMENTS OF THE PRESENT INVENTION

In order to solve the problem that there is no method for feeding back channel state information of dual-polarized channels, the present invention provides a method for feeding back channel state information in an example. The method will be described in detail below with reference to specific examples.

The example of the present invention will be further described below with reference to the drawings.

Figure 1:
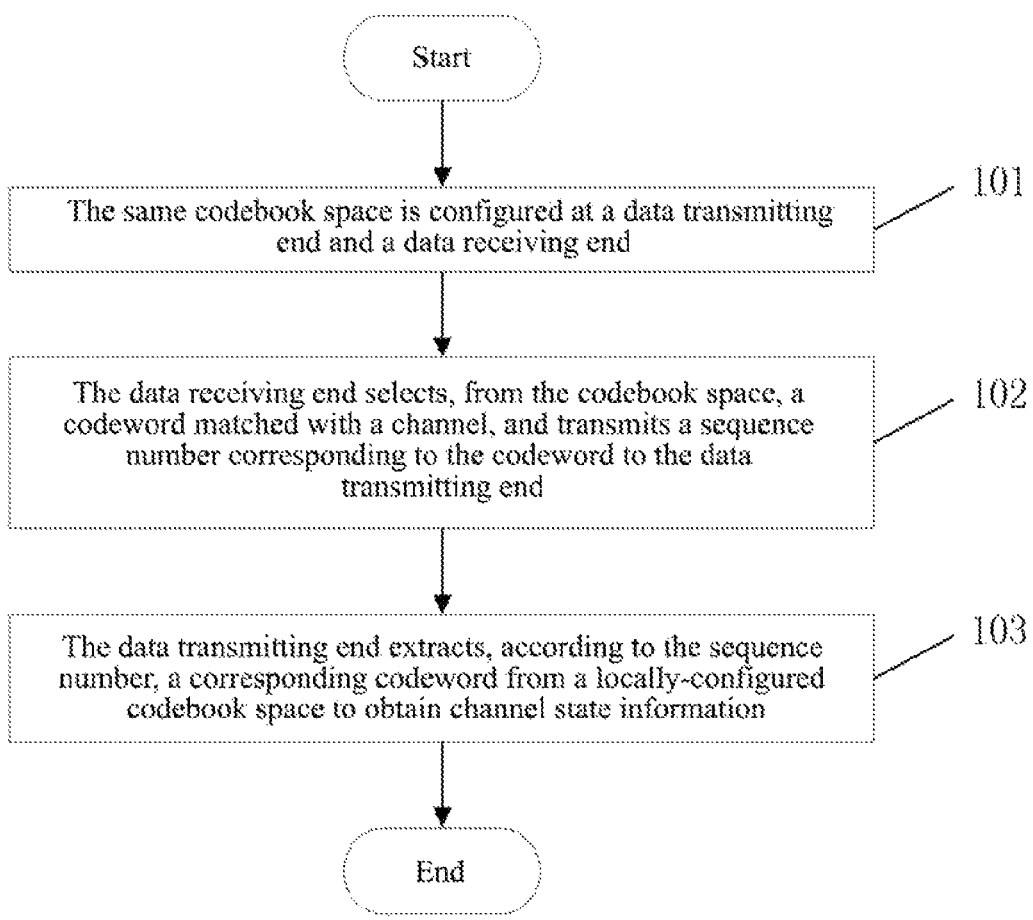
FIG. 1 is a flow chart of the method for feeding back the channel state information provided in an example of the present invention.

Example one of the present invention provides a method for channel state information feedback, wherein the same codebook space is configured at the data transmitting end and the data receiving end, and the codebook space is a universal codebook space that is applicable in a case of multiple Ranks The specific flow of the example one of the present invention is as shown in FIG. 1, comprising the following step.

Figure 2:
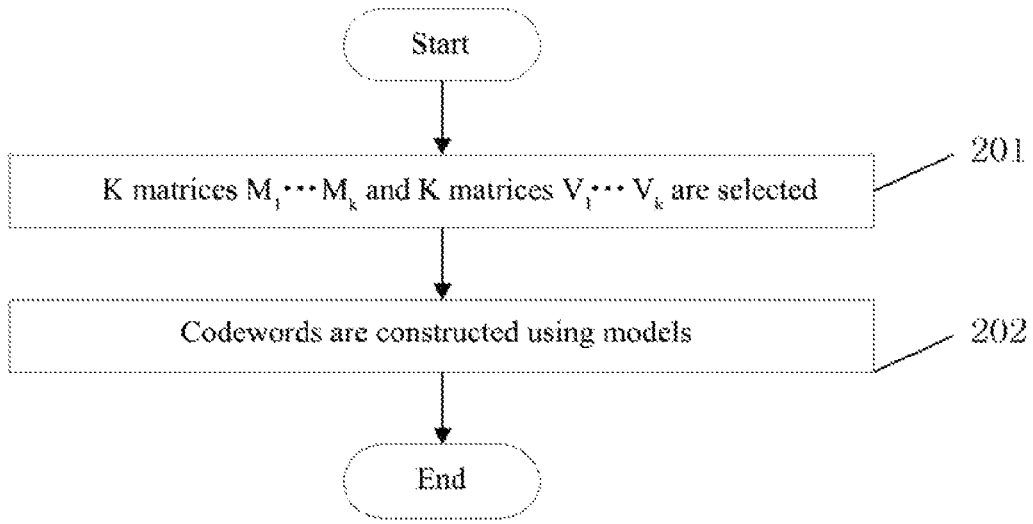
FIG. 2 is a flow chart of the method for implementing step 101 in FIG. 1.

Step 101, the same codebook space is configured at a data transmitting end and a data receiving end;

in this step, the same codebook space is configured at a data transmitting end and a data receiving end is the same, and the configuration principle is the same. The step is specifically as shown in FIG. 2, comprising the following step.

Step 201, κ matrices $M_1 \ldots M_\kappa$ and κ matrices $V_1 \ldots V_\kappa$ are are selected.

Wherein, the dimensionality of $M_1 \ldots M_\kappa$ is 4×I, the dimensionality of $V_1 \ldots V_\kappa$ is 4×J, what is to be constructed is a codebook with the Rank being 1, wherein, I+J=r, I and J are non-zero integers, I=J when r is an even number while I=J+1 or I=J−1 when r is an odd number. κ may be determined according to the requirements of the system. Considering that it may be necessary to construct a codebook that is applicable for various application scenes, the above κ codewords may also be used as a part of the codebook used in a certain application scene, and according to the probability of occurrence of the application scene, a proper number of other codewords are also added based on the above κ codewords.

Furthermore, the matrices $M_1 \ldots M_\kappa$ and $V_1 \ldots V_\kappa$ are are orthogonal matrices.

Furthermore, the matrices $M_1 \ldots M_\kappa$ and $V_1 \ldots V_\kappa$ meet a 8PSK feature, i.e., all elements in the above matrices are elements in a 8PSK letter set.

Furthermore, any column in the matrices $M_1 \ldots M_\kappa$ is extracted from a LTE Rank4 pre-coded codebook. Moreover, each column in $M_n$ may be from the same Rank4 codeword of the LTE Rank4 pre-coded codebook, or from different Rank4 codewords of the LTE Rank4 pre-coded codebook, and $M_n$ is any matrix among $M_1 \ldots M_\kappa$. Any column in the matrices $V_1 \ldots V_\kappa$ is extracted from a LTE Rank4 pre-coded codebook, and each column in $V_n$ may be from the same codeword or different codewords in the LTE Rank4 pre-coded codebook.

Since the LTE Rank4 pre-coded codebook has four rows, $M_1 \ldots M_\kappa$ and $V_1 \ldots V_\kappa$ are all matrices of four rows.

Furthermore, $M_n$ may be equal to $V_n$ or has a nesting relationship with $V_n$, i.e., part of $M_n$ may constitute $V_n$ or part of $V_n$ may constitute $M_n$.

In addition, $M_n$ may be nested in a codeword in the LTE Rank4 pre-coded codebook, and $V_n$ may be nested in another same or different codeword.

Step 102, the codewords are constructed using models: the models that are used are as follows in detail:

$$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

or $$\begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix}.$$

The codewords constructed by the above models can constitute the codebook space.

It should be pointed out that the transformed models obtained by implementing equivalent methods such as column exchange and row exchange based on the codewords constructed using the above models also fall into the protection scope of the example of the present invention, and the purpose of obtaining transformed models is only to adapt to different antenna serial numbers. In addition, multiplying the above columns in the above models by a constant coefficient also falls into the protection scope of the example of the present invention, the purpose of which is only to control the power.

If analyzed from the channel matrix features, when the codewords are constructed using the above models and the transmitting end is dual-polarized vertically and horizontally, for the channel matrix H, there is $H^H H$, which is in a form of 2M×2M block diagonal matrix $$\begin{bmatrix} A & O_{4\times 4} \\ O_{4\times 4} & B \end{bmatrix},$$

and the 2M×r matrix constituted by the former two feature vectors of the block diagonal matrix has a typical block structure, so the codebook of the feature vectors of the quantification channel matrix H should have a similar form as the feature vectors of $H^H H$.

During +/−45 degree dual-polarization of the transmitting end, for the channel matrix H, $H^H H$ is in the form of a 2M×2M block diagonal matrix $$\begin{bmatrix} A & B \\ B & A \end{bmatrix}.$$

The 2M×r matrix constituted by the former two feature vectors of the block diagonal matrix has a typical block structure, so the codebook of the feature vectors of the quantification channel matrix H should have a similar form as the feature vectors of $H^H H$.

When the Rank is 2, the specific process of constructing the codebook space using the method shown in FIG. 2 is as follows in detail:

κ M-dimensional vectors $w_{-1} \ldots w_{-\kappa}$ and κ M-dimensional vectors $v_1 \ldots v_\kappa$ are selected, wherein κ is a number of part or all of codewords that need to be generated in the codebook. Generally, the number of transmitting antennae is an even number, and if the number of the transmitting antennae of the data transmitting end is 2M, the codebook for 2M antennae needs to be constructed. The selected vectors $w_{-1} \ldots w_\kappa$ and $v_1 \ldots v_K$ should be M-dimensional vectors. $w_{-1} \ldots w_{-K}$ are any vectors extracted from a LTE Rank4 pre-coded codebook in Table 2, and $v_1 \ldots v_K$ are any vector extracted from a LTE Rank4 pre-coded codebook in Table 2. Then, the codewords are constructed using the following models:

$$\begin{bmatrix} w_1 & O_{4\times J} \\ O_{4\times I} & v_1 \end{bmatrix}, \begin{bmatrix} w_2 & O_{4\times J} \\ O_{4\times I} & v_2 \end{bmatrix} \ldots \begin{bmatrix} w_K & O_{4\times J} \\ O_{4\times I} & v_K \end{bmatrix}.$$

Since if analyzed from the channel matrix features, the transmitting end is dual-polarized vertically and horizontally, for the channel matrix H, $H^H H$ is in a form of $2M \times 2M$ block diagonal matrix $$\begin{bmatrix} A & O_{4\times 4} \\ O_{4\times 4} & B \end{bmatrix},$$

the $2M\times 2$ matrix constituted by the former two feature vectors of the block diagonal matrix is a block diagonal matrix, the codebook of the feature vectors of the quantification channel matrix H should have a similar form as the feature vectors of $H^H H$.

Or the following models are used $$\begin{bmatrix} w_1 & v_1 \\ \pm w_1 & \mu v_1 \end{bmatrix}, \begin{bmatrix} w_2 & v_2 \\ \pm w_2 & \mu v_2 \end{bmatrix} \ldots \begin{bmatrix} w_K & v_K \\ \pm w_K & \mu v_K \end{bmatrix}$$

Since if analyzed from the channel matrix features, during +/−45 degree dual-polarization of the transmitting end, for the channel matrix H, $H^H H$ is in a form of $2M \times 2M$ block diagonal matrix $$\begin{bmatrix} A & B \\ B & A \end{bmatrix},$$

the $2M\times 2$ matrix constituted by the former two feature vectors of the block diagonal matrix is a block diagonal matrix, the codebook of the feature vectors of the quantification channel matrix H should have a similar form as the feature vectors of $H^H H$.

When the Rank is 3, the specific process of constructing the codebook space using the method shown in FIG. 2 is as follows in detail:

κ M-dimensional vectors $w_{-1} \ldots w_{-K}$, κ M-dimensional vectors $v_1 \ldots v_K$, and κ M-dimensional vectors $z_1 \ldots z_K$ are selected, wherein $w_1 \ldots w_K$ are any vectors extracted from a LTE Rank4 pre-coded codebook in Table 2, $v_1 \ldots V_K$ are any vectors extracted from a LTE Rank4 pre-coded codebook in Table 2, and $z_1 \ldots z_K$ are vectors extracted from a LTE Rank4 pre-coded codebook in Table 2, and moreover, $z_i$ is orthogonal to at least one of $v_i$ and $w_i$. For example, $w_i$ is extracted from the codeword $W_n$ of the LTE Rank4 pre-coded codebook, $v_i$ is extracted from the codeword $W_m$ (m may be equal to n or not) of the LTE Rank4 pre-coded codebook, and $z_i$ is extracted from a column of $W_m$ not equal to $v_i$, and since $W_m$ is an orthogonal matrix, $z_i$ is orthogonal to $v_i$; or $z_i$ is extracted from a column of $W_n$ not equal to $w_i$, and since $W_n$ is an orthogonal matrix, $z_i$ is orthogonal to $w_i$. Then the codewords are constructed using the following models:

$$\begin{bmatrix} w_1 & O_{4\times 1} & z_1 \\ O_{4\times 1} & v_1 & O_{4\times 1} \end{bmatrix}, \begin{bmatrix} w_2 & O_{4\times 1} & z_2 \\ O_{4\times 1} & v_2 & O_{4\times 1} \end{bmatrix} \ldots \begin{bmatrix} w_K & O_{4\times 1} & z_K \\ O_{4\times 1} & v_K & O_{4\times 1} \end{bmatrix},$$

or using the following models:

$$\begin{bmatrix} w_1 & v_1 & z_1 \\ \pm w_1 & \mu v_1 & \pm z_1 \end{bmatrix}, \begin{bmatrix} w_2 & v_2 & z_2 \\ \pm w_2 & \mu v_2 & \pm z_2 \end{bmatrix} \ldots \begin{bmatrix} w_K & v_K & z_K \\ \pm w_K & \mu v_K & \pm z_K \end{bmatrix},$$

or using transformed models obtained by performing equivalent transforms of column exchange and row exchange.

When the Rank is 4, the specific process of constructing the codebook space using the method shown in FIG. 2 is as follows in detail:

κ M-dimensional vectors $w_{-1} \ldots w_{-K}$, κ M-dimensional vectors $v_1 \ldots v_K$, κ M-dimensional vectors $z_1 \ldots z_K$ and κ M-dimensional vectors $x_1 \ldots x_K$ are selected, wherein $w_1 \ldots w_K$ are any vectors extracted from a LTE Rank4 pre-coded codebook in Table 2, $v_1 \ldots v_K$ are any vectors extracted from a LTE Rank4 pre-coded codebook in Table 2, and $z_1 \ldots z_K$ are vectors extracted from a LTE Rank4 pre-coded codebook in Table 2, and moreover, $z_i$ is orthogonal to at least one of $v_i$ and $w_i$; $x_1 \ldots x_K$ are vectors extracted from a LTE Rank4 pre-coded codebook in Table 2, and moreover, $x_i$ is orthogonal to one of $v_i$ and $w_i$. For example, $w_i$ is extracted from the codeword $W_n$ of the LTE Rank4 pre-coded codebook, $v_i$ is extracted from the codeword $W_m$ of the LTE Rank4 pre-coded codebook, and $z_i$ is extracted from a column of $W_m$ not equal to $v_i$, and since $W_m$ is an orthogonal matrix, $z_i$ is orthogonal to $v_i$, and $x_i$ is extracted from a column of $W_n$ not equal to $w_i$, and since $W_n$ is an orthogonal matrix, $x_i$ is orthogonal to $w_i$; or $z_i$ is extracted from a column of $W_n$ not equal to $w_i$, and since $W_n$ is an orthogonal matrix, $z_i$ is orthogonal to $w_i$, and $x_i$ is extracted from a column of $W_m$ not equal to $v_i$, and since $W_m$ is an orthogonal matrix, $x_i$ is orthogonal to $v_i$. Then, the codewords are constructed using the following models:

$$\begin{bmatrix} w_1 & v_1 & z_1 & x_1 \\ \pm w_1 & \mu v_1 & \pm z_1 & \mu x_1 \end{bmatrix}, \begin{bmatrix} w_2 & v_2 & z_2 & x_2 \\ \pm w_2 & \mu v_2 & \pm z_2 & \mu x_2 \end{bmatrix}$$
$$\ldots \begin{bmatrix} w_K & v_K & z_K & x_K \\ \pm w_K & \mu v_K & \pm z_K & \mu x_K \end{bmatrix},$$

or using the following models:

$$\begin{bmatrix} w_1 & O_{4\times 1} & z_1 & O_{4\times 1} \\ O_{4\times 1} & v_1 & O_{4\times 1} & x_1 \end{bmatrix}, \begin{bmatrix} w_2 & O_{4\times 1} & z_2 & O_{4\times 1} \\ O_{4\times 1} & v_2 & O_{4\times 1} & x_2 \end{bmatrix}$$
$$\ldots \begin{bmatrix} w_K & O_{4\times 1} & z_K & O_{4\times 1} \\ O_{4\times 1} & v_K & O_{4\times 1} & x_K \end{bmatrix},$$

or using transformed models obtained by performing equivalent transforms of column exchange and row exchange.

When the Rank is 5, the specific process of constructing the codebook space using the method shown in FIG. 2 is as follows in detail:

κ matrices $M_1 \ldots M_K$ and κ matrices $V_1 \ldots V_K$ are selected, wherein the dimensionality of $M_1 \ldots M_K$ is 4×3, the dimensionality of $V_1 \ldots V_K$ is 4×2, and what is to be constructed is a Rank 5 codebook (3+2=5); $M_1 \ldots M_K$ are all extracted from the codewords of the LTE Rank3 pre-coded codebook, and $V_1 \ldots V_K$ are all extracted from the codewords of the LTE Rank2 pre-coded codebook. $M_n$ and $V_n$ may be from the codeword of the LTE Rank3 pre-coded codebook and the codeword of the LTE Rank2 pre-coded codebook with the same Index, or from different Indices, and n is an integer between 1 and κ (including 1 and κ); if they are from the same Index, $M_n$ may be equal to $V_n$ or has a nesting relationship with $V_n$, i.e., part of $M_n$ may constitute $V_n$ or part of $V_n$ may constitute $M_n$; or $M_n$ may be nested in a codeword in the LTE Rank4 pre-coded codebook, and $V_n$ may be nested in another same or different codeword, i.e., they are from different Indices. Then the codewords are constructed using the following models:

$$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \cdots \begin{bmatrix} M_K & O_{4\times J} \\ O_{4\times I} & V_K \end{bmatrix},$$

or using the following models:

$$\begin{bmatrix} M_1 & V_1 \\ M_1 & -V_1 \end{bmatrix}, \begin{bmatrix} M_2 & V_2 \\ M_2 & -V_2 \end{bmatrix} \cdots \begin{bmatrix} M_K & V_K \\ M_K & -V_K \end{bmatrix}.$$

When the Rank is 5, the specific process of another case of constructing the codebook space using the method shown in FIG. 2 is as follows in detail:

κ matrices $M_1 \ldots M_\kappa$ and κ matrices $V_1 \ldots V_\kappa$ are selected, wherein the dimensionality of $M_1 \ldots M_\kappa$ is 4×2, the dimensionality of $V_1 \ldots V_\kappa$ is 4×3, and what is to be constructed is a Rank 5 codebook (2+3=5); any column of $M_1 \ldots M_\kappa$ is extracted from the codewords of the LTE Rank1 pre-coded codebook, and any column of $V_1 \ldots V_\kappa$ is extracted from the codewords of the LTE Rank1 pre-coded codebook. Each column of $M_n$ may be from different codewords of the LTE Rank4 pre-coded codebook corresponding to different Indices (n is an integer between 1 and κ (including 1 and κ)), for example from the first column of $W_{12}$ and the first column of $W_{13}$; each column of $V_n$ may be from different codewords of the LTE Rank4 pre-coded codebook corresponding to different Indices, for example from the first column of $W_8$ the first column of $W_{10}$, and the first column of $W_{11}$. Then the codewords are constructed using the following models:

$$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \cdots \begin{bmatrix} M_K & O_{4\times J} \\ O_{4\times I} & V_K \end{bmatrix},$$

or using the following models:

$$\begin{bmatrix} M_1 & V_1 \\ M_1 & -V_1 \end{bmatrix}, \begin{bmatrix} M_2 & V_2 \\ M_2 & -V_2 \end{bmatrix} \cdots \begin{bmatrix} M_K & V_K \\ M_K & -V_K \end{bmatrix}.$$

Figure 3:
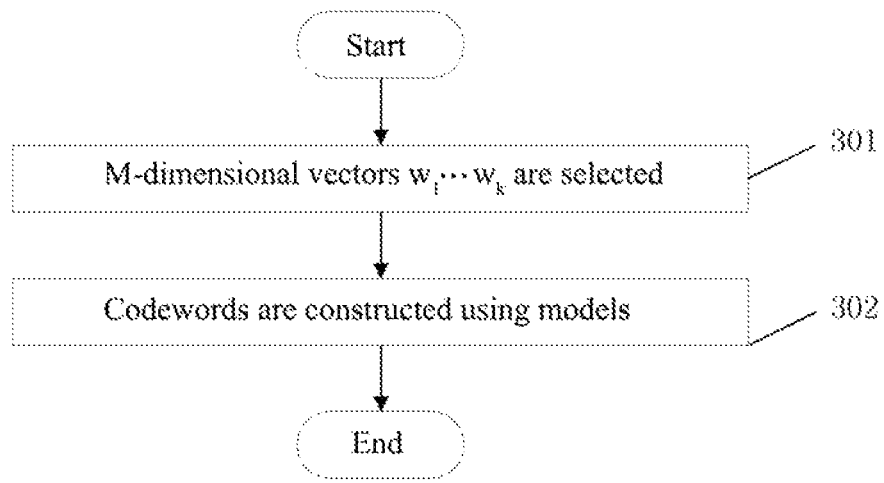
FIG. 3 is a flow chart of the method for implementing step 101 in FIG. 1 when Rank is 1.

In addition, in a case where Rank is 1, there is also a method for constructing a codebook space, the process of which is as shown in FIG. 3, comprising the following steps.

Step 301, κ M-dimensional vectors $w_{-1} \ldots w_{-\kappa}$ are selected.

In this step, κ is a number of part or all of codewords that need to be generated in the codebook. Generally, the number of transmitting antennae is an even number. When the number of the transmitting antennae of the data transmitting end is 2M, a codebook space with 2M antennae needs to be constructed. The selected vectors $w_{-1} \ldots w_{-\kappa}$ should be M-dimensional vectors.

The method for constructing $w_1 \ldots w_\kappa$ is to extract any vector from the LTE Rank4 pre-coded codebook in Table 2.

Any vectors can also be extracted from the LTE Rank1 codebook in Table 2 as $w_1 \ldots w_\kappa$.

Step 302, the codewords are constructed using the following models.

The following models are used:

$$\begin{bmatrix} w_n \\ O_{4\times 1} \end{bmatrix}$$

and/or $$\begin{bmatrix} O_{4\times J} \\ w_n \end{bmatrix},$$

wherein, n=1, 2 . . . κ.

The models used in this step are determined based on the main occurring scenes of Rank1. When the antennae of the transmitting end are dual-polarized vertically and horizontally while the receiving is single-polarized, the receiving end usually fails to receive the signals of M antennae in a certain polarization direction, so the feature vectors are occurrence of M 0 elements.

Codewords are generated according to the above models, and the codebook space can be constituted by the codewords.

The codebook space constructed in this step includes the following 8 codewords:

$$\begin{bmatrix} W_0^{\{1\}} \\ O_{4\times 1} \end{bmatrix}, \begin{bmatrix} W_1^{\{1\}} \\ O_{4\times 1} \end{bmatrix}, \cdots \begin{bmatrix} W_7^{\{1\}} \\ O_{4\times 1} \end{bmatrix},$$

or the following 8 codewords:

$$\begin{bmatrix} O_{4\times 1} \\ W_0^{\{1\}} \end{bmatrix}, \begin{bmatrix} O_{4\times 1} \\ W_1^{\{1\}} \end{bmatrix}, \cdots \begin{bmatrix} O_{4\times 1} \\ W_7^{\{1\}} \end{bmatrix}.$$

Or, the codebook space constructed in this step includes the following 16 codewords:

$$\begin{bmatrix} W_0^{\{1\}} \\ O_{4\times 1} \end{bmatrix}, \begin{bmatrix} O_{4\times 1} \\ W_0^{\{1\}} \end{bmatrix}, \begin{bmatrix} W_1^{\{1\}} \\ O_{4\times 1} \end{bmatrix}, \begin{bmatrix} O_{4\times 1} \\ W_1^{\{1\}} \end{bmatrix}, \cdots \begin{bmatrix} W_7^{\{1\}} \\ O_{4\times 1} \end{bmatrix}, \begin{bmatrix} O_{4\times 1} \\ W_7^{\{1\}} \end{bmatrix},$$

or the following 16 codewords:

$$\begin{bmatrix} W_0^{\{1\}} \\ O_{4\times 1} \end{bmatrix}, \begin{bmatrix} W_1^{\{1\}} \\ O_{4\times 1} \end{bmatrix}, \cdots \begin{bmatrix} W_{15}^{\{1\}} \\ O_{4\times 1} \end{bmatrix},$$

or the following 16 codewords:

$$\begin{bmatrix} O_{4\times 1} \\ W_0^{\{1\}} \end{bmatrix}, \begin{bmatrix} O_{4\times 1} \\ W_1^{\{1\}} \end{bmatrix}, \cdots \begin{bmatrix} O_{4\times 1} \\ W_{15}^{\{1\}} \end{bmatrix}.$$

Wherein, $W_0^{\{1\}} \ldots W_{15}^{\{1\}}$ are LTE Rank1 codewords in Table 2.

In addition, when the Rank is 1, there is also a case adapted for +/−45 degree dual-polarization of the transmitting end, at which moment, the codebook space may include the following 24 codewords:

$$\begin{bmatrix} w_0^{\{1\}} \\ w_0^{\{1\}} \end{bmatrix}, \begin{bmatrix} w_1^{\{1\}} \\ w_1^{\{1\}} \end{bmatrix}, \cdots \begin{bmatrix} w_7^{\{1\}} \\ w_7^{\{1\}} \end{bmatrix}, \begin{bmatrix} w_0^{\{1\}} \\ -w_0^{\{1\}} \end{bmatrix}, \begin{bmatrix} w_1^{\{1\}} \\ -w_1^{\{1\}} \end{bmatrix}, \cdots \begin{bmatrix} w_7^{\{1\}} \\ -w_7^{\{1\}} \end{bmatrix},$$

$$\begin{bmatrix} w_0^{\{1\}} \\ j*w_0^{\{1\}} \end{bmatrix}, \begin{bmatrix} w_1^{\{1\}} \\ j*w_1^{\{1\}} \end{bmatrix}, \cdots \begin{bmatrix} w_7^{\{1\}} \\ j*w_7^{\{1\}} \end{bmatrix},$$

or the following 48 codewords:

$$\begin{bmatrix} w_0^{\{1\}} \\ w_0^{\{1\}} \end{bmatrix}, \begin{bmatrix} w_1^{\{1\}} \\ w_1^{\{1\}} \end{bmatrix}, \cdots \begin{bmatrix} w_{15}^{\{1\}} \\ w_{15}^{\{1\}} \end{bmatrix}, \begin{bmatrix} w_0^{\{1\}} \\ -w_0^{\{1\}} \end{bmatrix}, \begin{bmatrix} w_1^{\{1\}} \\ -w_1^{\{1\}} \end{bmatrix}, \cdots \begin{bmatrix} w_{15}^{\{1\}} \\ -w_{15}^{\{1\}} \end{bmatrix},$$

$$\begin{bmatrix} w_0^{\{1\}} \\ j*w_0^{\{1\}} \end{bmatrix}, \begin{bmatrix} w_1^{\{1\}} \\ j*w_1^{\{1\}} \end{bmatrix}, \cdots \begin{bmatrix} w_{15}^{\{1\}} \\ j*w_{15}^{\{1\}} \end{bmatrix},$$

or the following 32 codewords:

$$\begin{bmatrix} w_0^{\{1\}} \\ w_0^{\{1\}} \end{bmatrix}, \begin{bmatrix} w_1^{\{1\}} \\ w_1^{\{1\}} \end{bmatrix}, \cdots \begin{bmatrix} w_7^{\{1\}} \\ w_7^{\{1\}} \end{bmatrix}, \begin{bmatrix} w_0^{\{1\}} \\ -w_0^{\{1\}} \end{bmatrix}, \begin{bmatrix} w_1^{\{1\}} \\ -w_1^{\{1\}} \end{bmatrix}, \cdots \begin{bmatrix} w_7^{\{1\}} \\ -w_7^{\{1\}} \end{bmatrix},$$

$$\begin{bmatrix} w_0^{\{1\}} \\ j*w_0^{\{1\}} \end{bmatrix}, \begin{bmatrix} w_1^{\{1\}} \\ j*w_1^{\{1\}} \end{bmatrix}, \cdots \begin{bmatrix} w_7^{\{1\}} \\ j*w_7^{\{1\}} \end{bmatrix},$$

$$\begin{bmatrix} w_0^{\{1\}} \\ -j*w_0^{\{1\}} \end{bmatrix}, \begin{bmatrix} w_1^{\{1\}} \\ -j*w_1^{\{1\}} \end{bmatrix}, \cdots \begin{bmatrix} w_7^{\{1\}} \\ -j*w_7^{\{1\}} \end{bmatrix},$$

or the following 64 codewords:

$$\begin{bmatrix} w_0^{\{1\}} \\ w_0^{\{1\}} \end{bmatrix}, \begin{bmatrix} w_1^{\{1\}} \\ w_1^{\{1\}} \end{bmatrix}, \cdots \begin{bmatrix} w_{15}^{\{1\}} \\ w_{15}^{\{1\}} \end{bmatrix}, \begin{bmatrix} w_0^{\{1\}} \\ -w_0^{\{1\}} \end{bmatrix}, \begin{bmatrix} w_1^{\{1\}} \\ -w_1^{\{1\}} \end{bmatrix}, \cdots \begin{bmatrix} w_{15}^{\{1\}} \\ w_{15}^{\{1\}} \end{bmatrix},$$

$$\begin{bmatrix} w_0^{\{1\}} \\ j*w_0^{\{1\}} \end{bmatrix}, \begin{bmatrix} w_1^{\{1\}} \\ j*w_1^{\{1\}} \end{bmatrix}, \cdots \begin{bmatrix} w_{15}^{\{1\}} \\ j*w_{15}^{\{1\}} \end{bmatrix},$$

$$\begin{bmatrix} w_0^{\{1\}} \\ -j*w_0^{\{1\}} \end{bmatrix}, \begin{bmatrix} w_1^{\{1\}} \\ -j*w_1^{\{1\}} \end{bmatrix}, \cdots \begin{bmatrix} w_{15}^{\{1\}} \\ -j*w_{15}^{\{1\}} \end{bmatrix}.$$

In a case where the Rank value is 6, 7 and 8, the implementing principle is the same as the above embodiment, and they all can be implemented by the method shown in FIG. 2, and thus will not be described here one by one.

Step 102, the data receiving end selects, from the codebook space, a codeword matched with a channel, and transmits a sequence number corresponding to the codeword to the data transmitting end.

Step 103, the data transmitting end extracts, according to the sequence number, a corresponding codeword from a locally-configured codebook space to obtain channel state information.

The example of the present invention provides a method for feeding back channel state information, wherein the same codebook space is configured at a data transmitting end and a data receiving end, the data receiving end selects, from the codebook space, a codeword matched with a channel, and transmits a sequence number corresponding to the codeword to the data transmitting end, and the data transmitting end extracts, according to the sequence number, a corresponding codeword from a locally-configured codebook space to obtain channel information, and during configuration of the codebook space, κ matrices $M_1 \ldots M_\kappa$ and κ matrices $V_1 \ldots V_\kappa$ are selected, wherein a dimensionality of $M_1 \ldots M_\kappa$ is 4×I, a dimensionality of $V_1 \ldots V_\kappa$ is 4×J, I+J=r, r is a rank of the channel, I and J are non-zero integers, I=J when r is an even number while I=J+1 or I=J−1 when r is an odd number, and the codeword in the codebook space is constructed using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \cdots \begin{bmatrix} M_K & O_{4\times J} \\ O_{4\times I} & V_K \end{bmatrix} \text{ or}$$

$$\begin{bmatrix} M_1 & V_1 \\ M_1 & -V_1 \end{bmatrix}, \begin{bmatrix} M_2 & V_2 \\ M_2 & -V_2 \end{bmatrix} \cdots \begin{bmatrix} M_K & V_K \\ M_K & -V_K \end{bmatrix},$$

thereby constructing a codebook space universal for multiple ranks, which solves the problem that there is no method for feeding back channel state information of dual-polarized channels, and meanwhile is adapted to cases with difference Rank values. The codewords in LTE Rank4 are used as the basis of the codewords in the codebook space, and the compatibility of the system is very good. Furthermore, for a channel with a rank of 1, κ M-dimensional vectors $w_{-1} \ldots w_{-\kappa}$ are selected, wherein κ is a number of part or all of codewords that need to be generated in the codebook, and M is one half of a number of transmitting antennae, and the codeword in the codebook space is constructed using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 . . . κ, which makes the construction and generation of the codebook space more flexible.

An example of the present invention further provides a system for feeding back channel state information, comprising a data transmitting end and a data receiving end;

the data transmitting end is configured to configure a same codebook space as the data receiving end, receive a sequence number of a codeword transmitted by the data receiving end, and extract, according to the sequence number, a corresponding codeword from a locally-configured codebook space to obtain channel state information;

the data receiving end is configured to configure a same codebook space as the data transmitting end, select, from the codebook space, the codeword matched with a channel, and transmit the sequence number corresponding to the codeword to the data transmitting end.

Furthermore, the data transmitting end is configured to configure a same codebook space as the data receiving end in the following way:

selecting κ matrices $M_1 \ldots M_\kappa$ and κ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a rank of the channel, I=J when r is an even number, and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or }$$

$$\begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_\kappa & V_\kappa \\ M_\kappa & -V_\kappa \end{bmatrix};$$

or when the rank of the channel is 1, selecting κ M-dimensional vectors $w_{\cdot 1} \ldots w_{\cdot \kappa}$, wherein κ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 … κ.

Furthermore, the data receiving end is configured to configure a same codebook space as the data transmitting end in the following way:

selecting κ matrices $M_1 \ldots M_\kappa$ and κ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a rank of the channel, I=J when r is an even number, and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or }$$

$$\begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_\kappa & V_\kappa \\ M_\kappa & -V_\kappa \end{bmatrix};$$

or when the rank of the channel is 1, selecting κ M-dimensional vectors $w_{\cdot 1} \ldots w_{\cdot \kappa}$, wherein κ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 … κ.

The above system for feeding back channel state information can be combined with the method for feeding back channel state information provided in the example of the present invention. The same codebook space is configured at a data transmitting end and a data receiving end, the data receiving end selects, from the codebook space, a codeword matched with a channel, and transmits a sequence number corresponding to the codeword to the data transmitting end, and the data transmitting end extracts, according to the sequence number, a corresponding codeword from a locally-configured codebook space to obtain channel information, and during configuration of the codebook space, κ matrices $M_1 \ldots M_\kappa$ and κ matrices are $V_1 \ldots V_\kappa$ are selected, wherein a dimensionality of $M_1 \ldots M_\kappa$ is 4×I, a dimensionality of $V_1 \ldots V_\kappa$ is 4×J, I+J=r, r is a rank of the channel, I and J are non-zero integers, I=J when r is an even number while I=J+1 or I=J−1 when r is an odd number, and the codeword in the codebook space is constructed using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or } \begin{bmatrix} M_1 & V_1 \\ M_1 & -V_1 \end{bmatrix},$$

$$\begin{bmatrix} M_2 & V_2 \\ M_2 & -V_2 \end{bmatrix} \ldots \begin{bmatrix} M_\kappa & V_\kappa \\ M_\kappa & -V_\kappa \end{bmatrix},$$

thereby constructing a codebook space universal for multiple ranks, which solves the problem that there is no method for feeding back channel state information of dual-polarized channels.

Furthermore, for a channel with a rank of 1, κ M-dimensional vectors $w_{\cdot 1} \ldots w_{\cdot \kappa}$ are selected, wherein κ is a number of part or all of codewords that need to be generated in the codebook, and M is one half of a number of transmitting antennae, and the codeword in the codebook space is constructed using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 … κ, which makes the construction and generation of the codebook space more flexible.

Those skilled in the art shall understand that all of or part of the steps in the above methods can be completed by instructing relevant hardware by programs, and the programs can be stored in a computer readable storage medium. The program, when implemented, comprises one of the steps of the method example or combination thereof.

In addition, each functional unit in each example of the present invention may be implemented in the form of hardware or be implemented in the form of software functional module. When implemented in the form of software functional module and sold or used as an independent product, the integrated module may also be stored in a computer readable storage medium.

The abovementioned storage medium may be a read only memory, a magnetic disk, or an optical disk, etc.

The above embodiments are only specific embodiments of the present invention, but the present invention is not limited thereto. Any variation or substitution that can be readily conceived by a person having ordinary skill in the art within the technical scope disclosed in the present invention should fall into the protection scope of the present invention. Therefore, the protection scope of the present invention should be defined by the claims.

Industrial Applicability

The method and system for feeding back channel information provided by the present invention solve the problem that there is no channel information feedback method for dual-polarized channels.

What is claimed is:

1. A method for feeding back channel state information, comprising the following steps of:
   configuring a same codebook space at a data transmitting end and a data receiving end;
   the data receiving end selecting, from the codebook space, a codeword matched with a channel, and transmitting a sequence number corresponding to the codeword to the data transmitting end; and
   the data transmitting end extracting, according to the sequence number, a corresponding codeword from a locally-configured codebook space to obtain channel state information,
   wherein, the step of configuring a same codebook space at a data transmitting end and a data receiving end comprises:
   selecting κ matrices $M_1 \ldots M_\kappa$ and κ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a rank of the channel, I and J are non-zero integers, I=J when r is an even number, and I=J+1 or I=J−1 when r is an odd number;
   constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_k & O_{4\times J} \\ O_{4\times I} & V_K \end{bmatrix} \text{ or } \begin{bmatrix} M_1 & V_1 \\ M_1 & -V_1 \end{bmatrix},$$
$$\begin{bmatrix} M_2 & V_2 \\ M_2 & -V_2 \end{bmatrix} \ldots \begin{bmatrix} M_K & V_K \\ M_K & -V_K \end{bmatrix},$$

and
   wherein O indicates an all-zero matrix.

2. The method according to claim 1, wherein,
   the matrices $M_1 \ldots M_\kappa$ and the matrices $V_1 \ldots V_\kappa$ are both orthogonal matrices.

3. The method according to claim 1, wherein,
   the matrices $M_1 \ldots M_\kappa$ and the matrices $V_1 \ldots V_\kappa$ meet a 8PSK (Phase Shift Keying) feature, i.e., all elements in the above matrices are elements in a 8PSK letter set;
   any column in any matrix in the matrices $M_1 \ldots M_\kappa$ is extracted from a same codeword or different codewords in a LTE Rank4 (Long Term Evolution rank 4) pre-coded codebook;
   any column in any matrix in the matrices is $V_1 \ldots V_\kappa$ is extracted from a same codeword or different codewords in a LTE Rank4 pre-coded codebook.

4. The method according to claim 1, wherein,
   $M_n$ has a nesting relationship with $V_n$, i.e., part of columns in $M_n$ constitute $V_n$ or part of columns in $V_n$ constitute $M_n$, wherein $M_n$ is any matrix among matrices $M_1 \ldots M_\kappa$, and $V_n$ is any matrix among matrices $V_1 \ldots V_\kappa$.

5. The method according to claim 1, wherein,
   $M_n$ is nested in a codeword in the LTE Rank4 (Long Term Evolution Rank 4) pre-coded codebook, and $V_n$ is nested in another same or different codeword in the LTE Rank4 pre-coded codebook, wherein, $M_n$ is any matrix among matrices $M_1 \ldots M_\kappa$, and $V_n$ is any matrix among matrices $V_1 \ldots V_\kappa$.

6. The method according to claim 1, wherein, the step of constructing the codeword in the codebook space comprises:
   performing one or more of transforms among column exchange, row exchange and multiplication by a constant coefficient on the models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or } \begin{bmatrix} M_1 & V_1 \\ M_1 & -V_1 \end{bmatrix},$$
$$\begin{bmatrix} M_2 & V_2 \\ M_2 & -V_2 \end{bmatrix} \ldots \begin{bmatrix} M_K & V_K \\ M_K & -V_K \end{bmatrix},$$

to obtain transformed models of the models of $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or } \begin{bmatrix} M_1 & V_1 \\ M_1 & -V_1 \end{bmatrix},$$
$$\begin{bmatrix} M_2 & V_2 \\ M_2 & -V_2 \end{bmatrix} \ldots \begin{bmatrix} M_K & V_K \\ M_K & -V_K \end{bmatrix},$$

and constructing the codeword using the transformed models of the models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix} \text{ or } \begin{bmatrix} M_1 & V_1 \\ M_1 & -V_1 \end{bmatrix},$$
$$\begin{bmatrix} M_2 & V_2 \\ M_2 & -V_2 \end{bmatrix} \ldots \begin{bmatrix} M_K & V_K \\ M_K & -V_K \end{bmatrix}.$$

7. The method according to claim 1, wherein, when the rank of the channel is 1, the step of configuring a same codebook space at a data transmitting end and a data receiving end comprises:
   selecting κ M-dimensional vectors $w_1 \ldots w_\kappa$, wherein κ is a number of part or all of codewords that need to be generated in the codebook, and M is one half of a number of transmitting antennae; and
   constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 … κ.

8. The method according to claim 7, wherein,
   the M-dimensional vectors $w_1 \ldots w_\kappa$ are any vectors extracted from a LTE Rank 4 (Long Term Evolution Rank4) pre-coded codebook.

9. The method according to claim 7, wherein,
   the M-dimensional vectors $w_1 \ldots w_\kappa$ are any vectors extracted from a LTE Rank1 (Long Term Evolution Rank1) pre-coded codebook.

10. The method according to claim 8, wherein, the codebook space comprises the following 8 codewords:

$$\begin{bmatrix} W_0^{\{1\}} \\ O_{4\times I} \end{bmatrix}, \begin{bmatrix} W_1^{\{1\}} \\ O_{4\times I} \end{bmatrix}, \cdots \begin{bmatrix} W_7^{\{1\}} \\ O_{4\times I} \end{bmatrix},$$

or the following 8 codewords:

$$\begin{bmatrix} O_{4\times I} \\ W_0^{\{1\}} \end{bmatrix}, \begin{bmatrix} O_{4\times I} \\ W_1^{\{1\}} \end{bmatrix}, \cdots \begin{bmatrix} O_{4\times I} \\ W_7^{\{1\}} \end{bmatrix},$$

or, the codebook space comprises the following 16 codewords:

$$\begin{bmatrix} W_0^{\{1\}} \\ O_{4\times I} \end{bmatrix}, \begin{bmatrix} O_{4\times I} \\ W_0^{\{1\}} \end{bmatrix}, \begin{bmatrix} W_1^{\{1\}} \\ O_{4\times I} \end{bmatrix}, \begin{bmatrix} O_{4\times I} \\ W_1^{\{1\}} \end{bmatrix} \cdots \begin{bmatrix} W_7^{\{1\}} \\ O_{4\times I} \end{bmatrix}, \begin{bmatrix} O_{4\times I} \\ W_7^{\{1\}} \end{bmatrix},$$

or the following 16 codewords:

$$\begin{bmatrix} W_0^{\{1\}} \\ O_{4\times I} \end{bmatrix}, \begin{bmatrix} W_1^{\{1\}} \\ O_{4\times I} \end{bmatrix}, \cdots \begin{bmatrix} W_{15}^{\{1\}} \\ O_{4\times I} \end{bmatrix},$$

or the following 16 codewords:

$$\begin{bmatrix} O_{4\times I} \\ W_0^{\{1\}} \end{bmatrix}, \begin{bmatrix} O_{4\times I} \\ W_1^{\{1\}} \end{bmatrix}, \cdots \begin{bmatrix} O_{4\times I} \\ W_{15}^{\{1\}} \end{bmatrix},$$

wherein, $W_0^{\{1\}} \ldots W_{15}^{\{1\}}$ are codewords in the LTE Rank1 pre-coded codebook.

11. The method according to claim 8, wherein, when the transmitting end is +/−45 degree dual-polarized, the codebook space comprises the following 24 codewords:

$$\begin{bmatrix} W_0^{\{1\}} \\ W_0^{\{1\}} \end{bmatrix}, \begin{bmatrix} W_1^{\{1\}} \\ W_1^{\{1\}} \end{bmatrix}, \cdots \begin{bmatrix} W_7^{\{1\}} \\ W_7^{\{1\}} \end{bmatrix}, \begin{bmatrix} W_0^{\{1\}} \\ -W_0^{\{1\}} \end{bmatrix},$$

$$\begin{bmatrix} W_1^{\{1\}} \\ -W_1^{\{1\}} \end{bmatrix}, \cdots \begin{bmatrix} W_7^{\{1\}} \\ -W_7^{\{1\}} \end{bmatrix}, \begin{bmatrix} W_0^{\{1\}} \\ j*W_0^{\{1\}} \end{bmatrix}, \begin{bmatrix} W_1^{\{1\}} \\ j*W_1^{\{1\}} \end{bmatrix}, \cdots \begin{bmatrix} W_7^{\{1\}} \\ j*W_7^{\{1\}} \end{bmatrix},$$

or the following 48 codewords:

$$\begin{bmatrix} W_0^{\{1\}} \\ W_0^{\{1\}} \end{bmatrix}, \begin{bmatrix} W_1^{\{1\}} \\ W_1^{\{1\}} \end{bmatrix}, \cdots \begin{bmatrix} W_{15}^{\{1\}} \\ W_{15}^{\{1\}} \end{bmatrix}, \begin{bmatrix} W_0^{\{1\}} \\ -W_0^{\{1\}} \end{bmatrix},$$

$$\begin{bmatrix} W_1^{\{1\}} \\ -W_1^{\{1\}} \end{bmatrix}, \cdots \begin{bmatrix} W_{15}^{\{1\}} \\ -W_{15}^{\{1\}} \end{bmatrix}, \begin{bmatrix} W_0^{\{1\}} \\ j*W_0^{\{1\}} \end{bmatrix}, \begin{bmatrix} W_1^{\{1\}} \\ j*W_1^{\{1\}} \end{bmatrix}, \cdots \begin{bmatrix} W_{15}^{\{1\}} \\ j*W_{15}^{\{1\}} \end{bmatrix},$$

or the following 32 codewords:

$$\begin{bmatrix} W_0^{\{1\}} \\ W_0^{\{1\}} \end{bmatrix}, \begin{bmatrix} W_1^{\{1\}} \\ W_1^{\{1\}} \end{bmatrix}, \cdots \begin{bmatrix} W_7^{\{1\}} \\ W_7^{\{1\}} \end{bmatrix}, \begin{bmatrix} W_0^{\{1\}} \\ -W_0^{\{1\}} \end{bmatrix},$$

$$\begin{bmatrix} W_1^{\{1\}} \\ -W_1^{\{1\}} \end{bmatrix}, \cdots \begin{bmatrix} W_7^{\{1\}} \\ -W_7^{\{1\}} \end{bmatrix}, \begin{bmatrix} W_0^{\{1\}} \\ j*W_0^{\{1\}} \end{bmatrix},$$

-continued $$\begin{bmatrix} W_1^{\{1\}} \\ j*W_1^{\{1\}} \end{bmatrix}, \cdots \begin{bmatrix} W_7^{\{1\}} \\ j*W_7^{\{1\}} \end{bmatrix}, \begin{bmatrix} W_0^{\{1\}} \\ -j*W_0^{\{1\}} \end{bmatrix}, \begin{bmatrix} W_1^{\{1\}} \\ -j*W_1^{\{1\}} \end{bmatrix}, \cdots \begin{bmatrix} W_7^{\{1\}} \\ -j*W_7^{\{1\}} \end{bmatrix},$$

or
the following 64 codewords:

$$\begin{bmatrix} W_0^{\{1\}} \\ W_0^{\{1\}} \end{bmatrix}, \begin{bmatrix} W_1^{\{1\}} \\ W_1^{\{1\}} \end{bmatrix}, \cdots \begin{bmatrix} W_{15}^{\{1\}} \\ W_{15}^{\{1\}} \end{bmatrix}, \begin{bmatrix} W_0^{\{1\}} \\ -W_0^{\{1\}} \end{bmatrix},$$

$$\begin{bmatrix} W_1^{\{1\}} \\ -W_1^{\{1\}} \end{bmatrix}, \cdots \begin{bmatrix} W_{15}^{\{1\}} \\ -W_{15}^{\{1\}} \end{bmatrix}, \begin{bmatrix} W_0^{\{1\}} \\ j*W_0^{\{1\}} \end{bmatrix},$$

$$\begin{bmatrix} W_1^{\{1\}} \\ j*W_1^{\{1\}} \end{bmatrix}, \cdots \begin{bmatrix} W_{15}^{\{1\}} \\ j*W_{15}^{\{1\}} \end{bmatrix}, \begin{bmatrix} W_0^{\{1\}} \\ -j*W_0^{\{1\}} \end{bmatrix}, \begin{bmatrix} W_1^{\{1\}} \\ -j*W_1^{\{1\}} \end{bmatrix}, \cdots \begin{bmatrix} W_{15}^{\{1\}} \\ -j*W_{15}^{\{1\}} \end{bmatrix};$$

wherein, $W_0^{\{1\}} \ldots W_{15}^{\{1\}}$ are codewords in the LTE Rank1 pre-coded codebook.

12. A system for feeding back channel state information, comprising a data transmitting end and a data receiving end;

the data transmitting end is configured to configure a same codebook space as the data receiving end, receive a sequence number of a codeword transmitted by the data receiving end, and extract, according to the sequence number, a corresponding codeword from a locally-configured codebook space to obtain channel state information;

the data receiving end is configured to configure a same codebook space as the data transmitting end, select, from the codebook space, the codeword matched with a channel, and transmit the sequence number corresponding to the codeword to the data transmitting end, wherein, the data transmitting end is configured to configure a same codebook space as the data receiving end in the following way:

selecting κ matrices $M_1 \ldots M_{78}$ and matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a rank of the channel, I=J when r is an even number and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \cdots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \cdots \begin{bmatrix} M_K & V_K \\ M_K & -V_K \end{bmatrix};$$

or
when the rank of the channel is 1, selecting κ M-dimensional vectors $w_{-1} \ldots w_{-\kappa}$, wherein κ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n−1, 2 . . . κ,
wherein O indicates an all-zero matrix.

13. The system according to claim 12, wherein, the data receiving end is configured to configure a same codebook space as the data transmitting end in the following way:

selecting κ matrices $M_1 \ldots M_\kappa$ and κ matrices $V_1 \ldots V_\kappa$, wherein a dimensionality of $M_1 \ldots M_\kappa$ is 4×I, a dimensionality of $V_1 \ldots V_\kappa$ is 4×J, I+J=r, r is a rank of the channel, I=J when r is an even number, and I=J+1 or I=J−1 when r is an odd number, and constructing the codeword in the codebook space using models $$\begin{bmatrix} M_1 & O_{4\times J} \\ O_{4\times I} & V_1 \end{bmatrix}, \begin{bmatrix} M_2 & O_{4\times J} \\ O_{4\times I} & V_2 \end{bmatrix} \ldots \begin{bmatrix} M_K & O_{4\times J} \\ O_{4\times I} & V_K \end{bmatrix}$$

$$\text{or } \begin{bmatrix} M_1 & V_1 \\ M_1 & -V_1 \end{bmatrix}, \begin{bmatrix} M_2 & V_2 \\ M_2 & -V_2 \end{bmatrix} \ldots \begin{bmatrix} M_K & V_K \\ M_K & -V_K \end{bmatrix};$$

or when the rank of the channel is 1, selecting κ M-dimensional vectors $w_{\cdot 1} \ldots w_{\cdot \kappa}$, wherein κ is a number of part or all of codewords that need to be generated in the codebook, and M is one half of a number of transmitting antennae, and constructing the codeword in the codebook space using a model $$\begin{bmatrix} w_n \\ O_{4\times I} \end{bmatrix}$$

and/or $$\begin{bmatrix} O_{4\times J} \\ w_n \end{bmatrix},$$

wherein n=1, 2 . . . κ.

* * * * *